(12) United States Patent
Kurosu et al.

(10) Patent No.: US 6,377,064 B1
(45) Date of Patent: *Apr. 23, 2002

(54) IC DEVICE INSPECTION APPARATUS

(75) Inventors: Osamu Kurosu, Date-gun; Kazuhiro Kawaguchi, Kikuchi; Kazuya Tsujino, Sagamihara; Yasuyuki Takata, Fukuoka; Keisuke Yoshida, Maebaru, all of (JP)

(73) Assignees: NEC Corporation; Y.A.C. Co., Ltd., both of Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/607,165

(22) Filed: Jun. 29, 2000

(30) Foreign Application Priority Data

Jul. 2, 1999 (JP) .......................................... 11-188382

(51) Int. Cl.[7] ................................................ F25B 29/00
(52) U.S. Cl. ...................... 324/760; 324/158.1; 209/537
(58) Field of Search ................................ 324/760, 754, 324/158.1; 209/537; 713/312

(56) References Cited

U.S. PATENT DOCUMENTS 6,262,584 B1 * 7/2001 Kurosu et al. .............. 324/760

FOREIGN PATENT DOCUMENTS

JP             6-188295         7/1994

* cited by examiner

Primary Examiner—Safet Metjahic
Assistant Examiner—Jimmy Nguyen
(74) Attorney, Agent, or Firm—Frishauf, Holtz, Goodman, Langer & Chick, P.C.

(57) ABSTRACT

An IC device to be inspected is received in a chamber, and an IC tester Judges performance of the IC device. An electrical connection device is arranged outside the chamber and has a conductive passage electrically connecting between the IC tester and the IC device. An IC socket is retained on the electrical connection device, for having the IC device inserted therein. A magnetometric sensor is arranged close to the conductive passage of the electrical connection device, for detecting a magnetic field generated when electric current is supplied to the IC device. A temperature control device controls a temperature of the IC device. A control unit controls the temperature control device based on a signal delivered from the magnetometric sensor, to maintain the temperature of the IC device within a predetermined temperature range.

5 Claims, 4 Drawing Sheets

IC DEVICE INSPECTION APPARATUS

BACKGROUND OF THE INVENTION

1. Field of the Invention

This invention relates to an IC device inspection apparatus which is capable of evaluating performance of an IC device correctly.

2. Description of the Prior Art

Inspection of temperature characteristics of an IC device is carried out in an environment which is held at a predetermined temperature (thermostatic bath or chamber).

The temperature set point of the chamber is set e.g. at −50° C. to +150° C. according to inspection programs.

Further, electric current is supplied to the IC device under test in various patterns according to many different test items of an inspection program. As a result, the IC device generates heat by Joule's law in a different pattern, dependent on the test item. The heat generation is more conspicuous in the case of inspecting an IC device which has a high integration density, such as a microprocessor (NPU) installed in a computer.

In recent years, the processing capacity or speed of microprocessors has been markedly increased, and their integration density has also become higher, resulting in increased watt densities (W/cm$^2$) of such microprocessors under test. Therefore, IC devices including MPUs tend to generate a still larger amount of heat.

For example, when a microprocessor generates approximately 30 watts of heat during inspection, the temperature of the microprocessor becomes higher than the set point temperature of the chamber by 40° C. or so.

Further, the amount of heat generated by an IC device becomes larger as the frequency of an electric signal supplied thereto is higher.

Moreover, it is reported that the maximum operating frequency of the microprocessor is lowered with an increase in the temperature of the same due to a lowered switching frequency of transistors, and that if the temperature of the microprocessor rises by 10° C., the maximum operating frequency of the same is reduced by 2%.

For example, when the temperature of a microprocessor capable of operating at a maximum operating frequency of 500 MHz becomes 4° C. higher than the set point temperature of the chamber, the actual maximum operating frequency of the microprocessor falls by no less than 40 MHz. Therefore, the microprocessor which should be ranked in itself in a class in which operation at 500 MHz is ensured is demoted by one grade or class and ranked as a class of microprocessors for operation at the maximum operating frequency on the order of 400 MHz.

As a result, yields of microprocessors for operation at high operating frequencies are unduly deteriorated, causing a serious loss.

Further, when an IC device undergoes a larger amount of heat generation, it is in danger of destroying itself.

Conventionally, with a view to enhancing accuracy of inspection (i.e. yield of properly ranked IC devices) and preventing self-destruction of IC devices, the temperature of an IC device under test is monitored, whereby the IC device is cooled to the set point temperature of the chamber.

The temperature of an IC device can be measured by a method using a contact temperature sensor such as a thermocouple or a non-contact temperature sensor such as an infrared sensor.

Further, another method can be employed in which a temperature sensor is incorporated in an IC device under test and the temperature of the IC device is measured by is the temperature sensor, as disclosed in Japanese Laid-Open Patent Publication (Kokai) No. 6-188295.

However, the contact temperature sensor can scratch or soil a package surface of an IC device, causing degradation of the value of the IC device as a commercial product.

On the other hand, the non-contact temperature sensor such as an infrared sensor cannot accurately measure the temperature of an IC device having a metal surface.

Further, the method using the temperature sensor incorporated in the IC device has the inconveniences that the size and weight of the IC device are increased and manufacturing costs of the same are largely increased.

SUMMARY OF THE INVENTION

It is an object of the invention to provide an IC device inspection apparatus which is capable of measuring a temperature of an IC device accurately without scratching or soiling the IC device as well as evaluating performance of the IC device correctly even when a temperature sensor is not incorporated in the IC device.

To attain the above object, the present invention provides an IC device inspection apparatus comprising:

a chamber for receiving therein an IC device to be inspected;

an IC tester for judging performance of the IC device;

electrical connection means arranged outside the chamber and having a conductive passage electrically connecting between the IC tester and the IC device;

go an IC socket retained on the electrical connection means, for having the IC device inserted therein;

magnetometric detection means arranged close to the conductive passage of the electrical connection means, for detecting a magnetic field generated when electric current is supplied from the IC tester to the IC device;

temperature control means for controlling a temperature of the IC device; and control means for controlling the temperature control means based on a signal delivered from the magnetometric detection means, to maintain the temperature of the IC device within a predetermined temperature range.

According to this IC device inspection apparatus, the magnetometric detection means detects the magnetic field which is generated when electric current is supplied from the IC tester via the electrical connection means to the IC device, and varies every moment with the amount of the electric current. The control means controls the temperature control means based on the signal from the magnetometric detection means such that the temperature of the IC device is maintained within a predetermined temperature range.

The electrical connection means is arranged outside the chamber, and the magnetometric detection means is arranged in proximity to the conductive passage of the electrical connection means to thereby keep the magnetometric detection means distant from a source of magnetic noise, so that magnetic noise has little adverse effect on the magnetometric detection means. Further, this arrangement makes it possible to prevent sensing characteristics of the magnetometric detection means from being seriously changed when testing causes an IC device to generate heat to heat itself to high temperatures.

Further, differently from an infrared sensor, the magnetometric detection means is capable of measuring the amount of variation or changes in the temperature of the IC device accurately even when the IC device has a metal surface. Still further, differently from a temperature sensor such as a thermocouple, since the magnetometric detection means is not required to be brought into contact with the IC device, the IC device cannot be scratched or soiled by the magnetometric detection means. Moreover, it is not required to install a temperature sensor in the IC device as in the prior art, so that it is possible to prevent an increase in size and weight of the IC device.

Preferably, the IC device inspection apparatus includes conversion means for converting the signal delivered from the magnetometric detection means to information indicative of an amount of heat generated by the IC device, and the control means controls the temperature control means based on the information from the conversion means, to maintain the temperature of the IC device within the predetermined temperature range.

According to this preferred embodiment, the conversion means converts the signal from the magnetometric detection means to information indicative of an amount of heat generated by the IC device. Based on this information from the conversion means, the control means generates and sends out an instruction responsive to a change in the amount of heat generated by the IC device to the temperature control means, and the temperature control means controls the temperature of the IC device according to the instruction.

More preferably, the temperature control means comprises cold air supply means for supplying a jet of cold air to the IC device, and the control means controls both of a time period over which the jet of cold air is supplied to the IC device and a flow rate of the jet of the cold air, in a feed forward manner based on the information from the conversion means.

Preferably, the chamber has a bottom plate formed with an opening extending therethrough, the IC socket being inserted in the opening, the magnetometric detection means being mounted on an underside of the bottom plate.

Preferably, the electrical connection means comprises a printed circuit board.

The above and other objects, features and advantages of the present invention will become more apparent from the following detailed description taken in conjunction with accompanying drawings.

DETAILED DESCRIPTION OF THE PREFERRED EMBODIMENTS

The invention will now be described in detail with reference to drawings showing preferred embodiments thereof.

Figure 1:
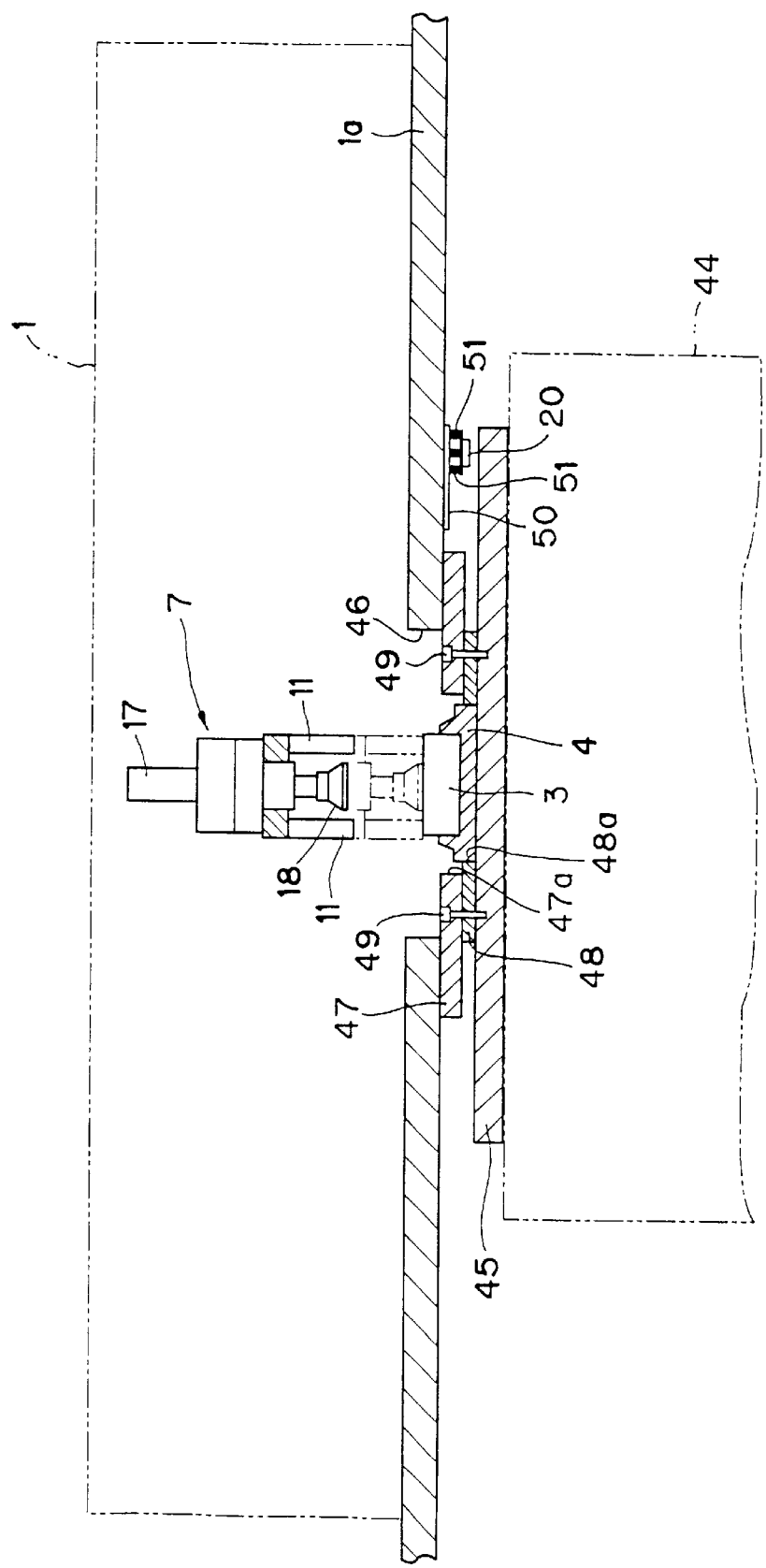
FIG. 1 is a longitudinal cross-sectional view showing part of an IC device inspection apparatus according to an embodiment of the invention.
Figure 2:
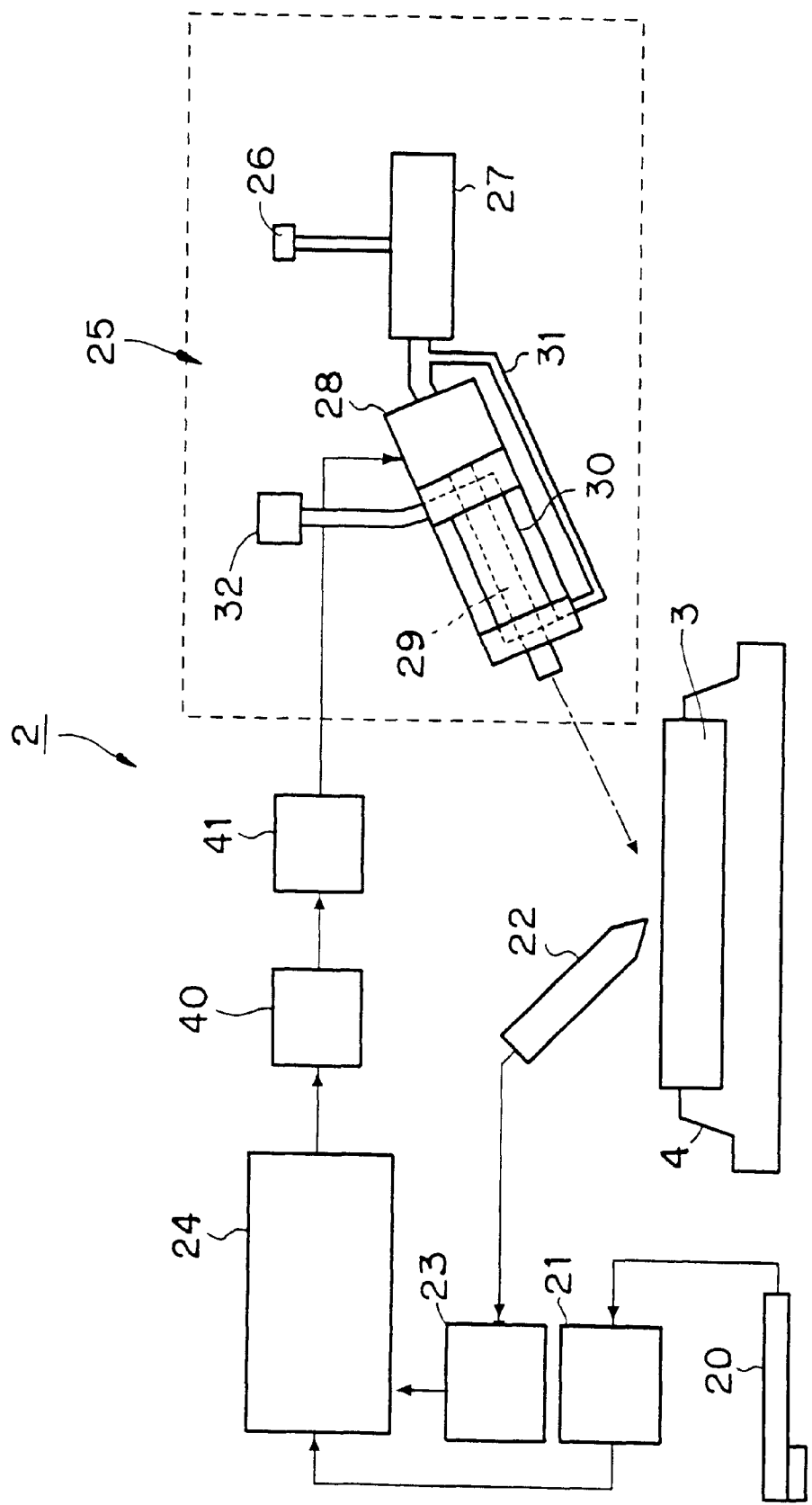
FIG. 2 is a block diagram showing a temperature control system.
Figure 3:
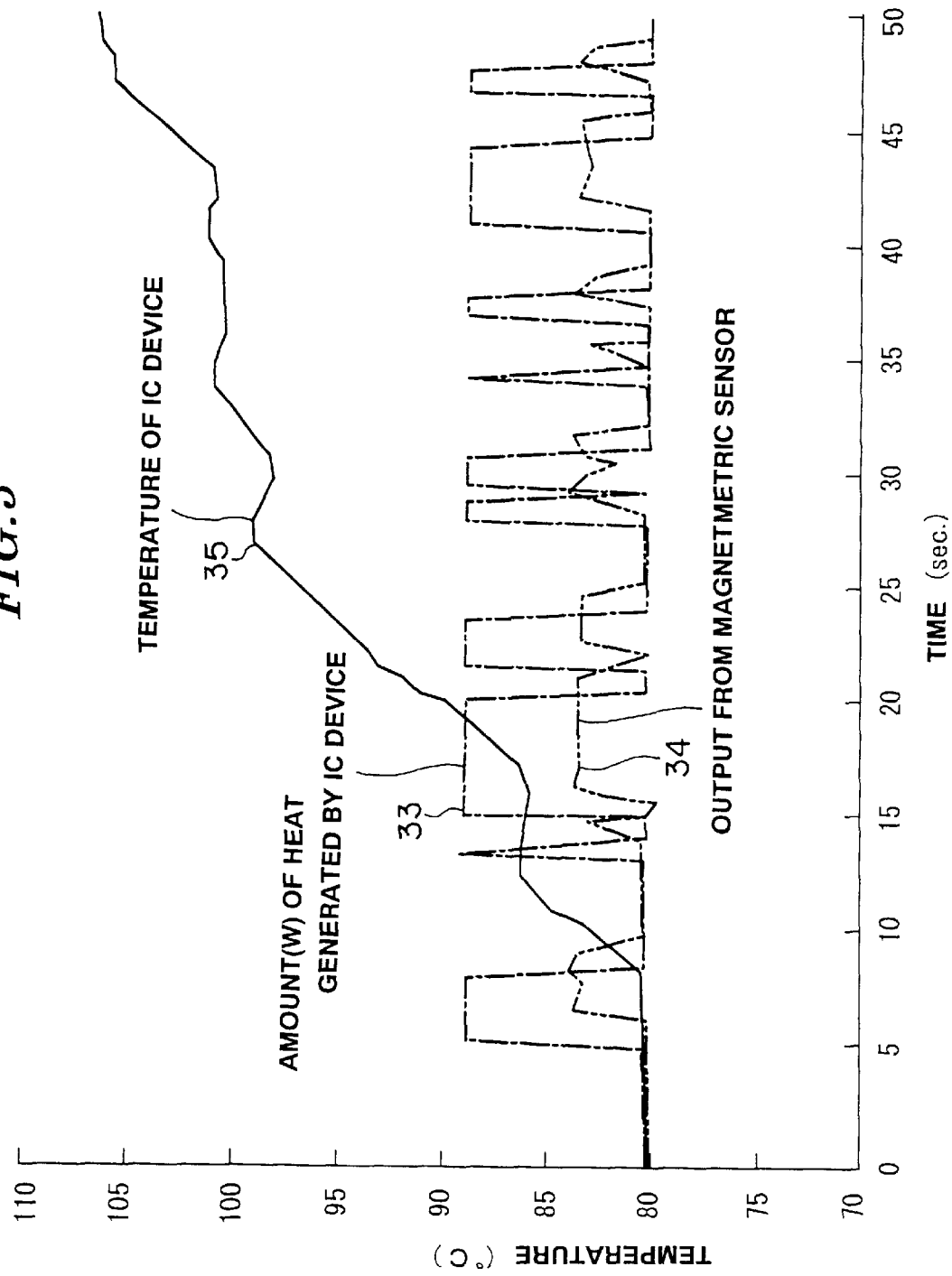
FIG. 3 is a graph showing the relationship between an output from a magnetometric sensor and the amount of heat generated by the IC device.
Figure 4:
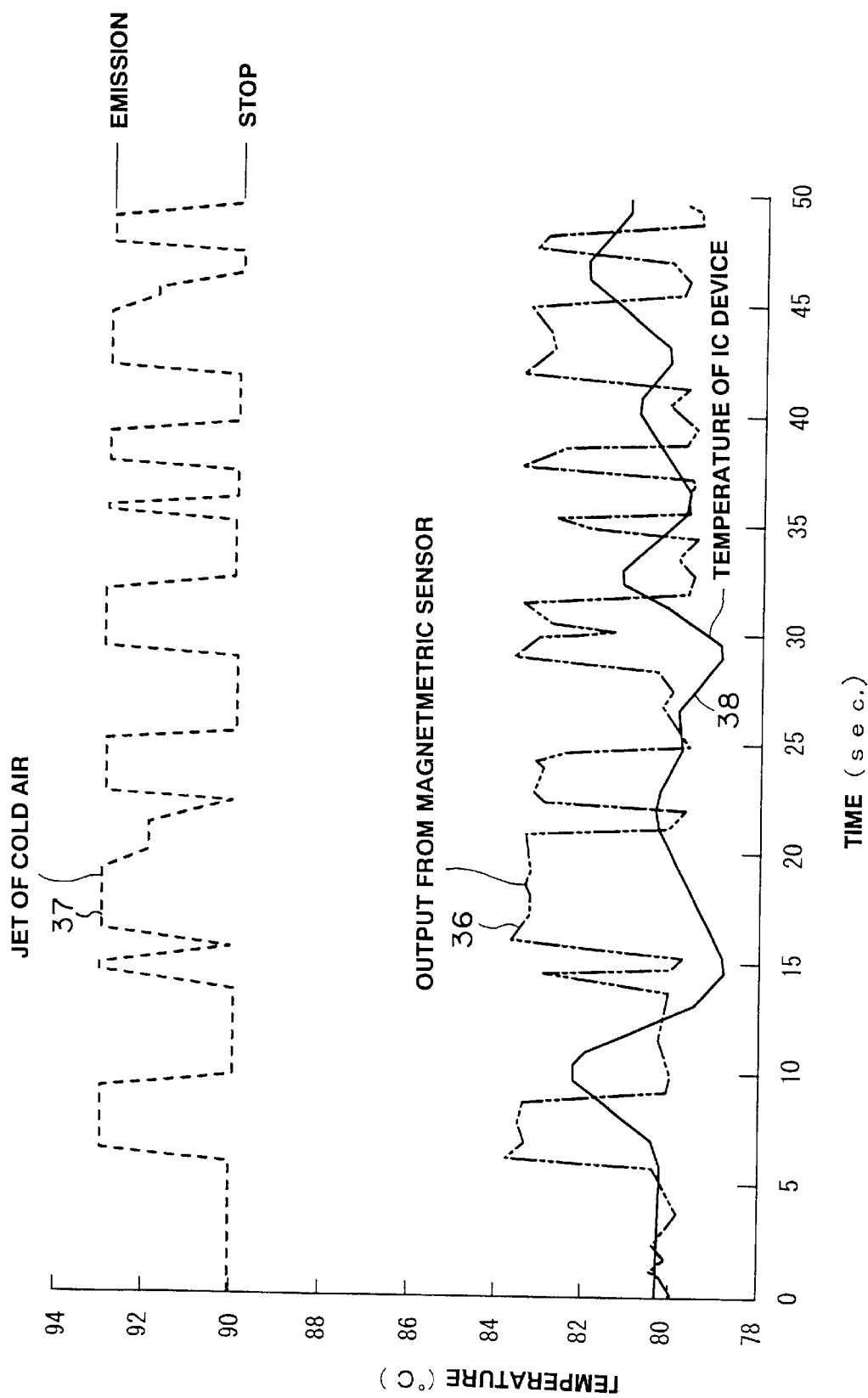
FIG. 4 is a graph showing the relationship between timing of delivery of Jets of cold air and the temperature of the IC device.

FIG. 1 is a longitudinal cross-sectional view showing part of an IC device inspection apparatus according to an embodiment of the present invention. FIG. 2 is a block diagram showing a temperature control system. FIG. 3 is a graph showing the relationship between an output from a magnetometric sensor and the amount of heat generated by the IC device, while FIG. 4 is an graph showing the relationship between timing of delivery of jets of cold air and the temperature of the IC device.

The IC device inspection apparatus is comprised of an IC tester 44, a printed circuit board (electrical connection means) 45. a chamber 1, an IC device carrier head 7, and a temperature control system 2 (see FIG. 2).

The IC tester 44 Judges performance of an IC device 3. The IC tester 44 is connected to a bottom plate 1a of the chamber 1 via the printed circuit board 45.

The bottom plate 1a of the chamber 1 has an opening 46 formed through a central portion thereof, and a mounting plate 47 is secured to a periphery of the opening 46. A magnetometric sensor (magnetometric detection means) 20, referred to hereinafter, is mounted on an underside surface of the bottom plate 1a of the chamber 1 via a support bracket 50.

The printed circuit board 45 electrically connects between the IC tester 44 and the IC device 3. The printed circuit board 45 is fixedly arranged on the top of the IC tester 44, i.e. located outside the chamber 1 (see FIG. 1). At a central portion of the printed circuit board 45, there is fixedly mounted a socket guide plate 48 formed of an insulating material. The socket guide plate 48 is formed with a central hole 48a in which an IC socket 4 is fitted. The IC device 3 is set on the printed circuit board 45 via the IC socket 4.

In connecting the IC tester 44 to the bottom plate 1a of the chamber 1, the IC socket 4 is inserted into a central hole 47a of the mounting plate 47, and then the mounting plate 47 and the printed circuit board 45 are fixed to each other by fixing screws 49 via the socket guide plate 48. The IC socket 4 and the IC device 3 face the inner space of the chamber 1 through the opening 46 of the bottom plate 1a of the chamber 1.

An IC device carrier head 7 is comprised of a vacuum pipe 17, a vacuum nozzle 18 mounted at a lower end of the vacuum pipe 17, a plurality of device pressers 11, and nozzle lifting/lowering means, not shown. At an upper portion of the IC device carrier head 7, there is arranged a motor, not shown, for driving the IC device carrier head 7 vertically. The IC device carrier head 7 is accommodated in the chamber 1. The inside of the chamber 1 is held at a set point temperature.

The IC device carrier head 7 picks up an IC device 3 by vacuum from a standby tray, not shown, before executing inspection, and then sets the same in the IC socket 4. After the inspection, the IC device carrier head 7 picks up the IC device 3 from the IC socket 4 to place the same on a product tray, not shown.

When the IC device carrier head 7 is lowered to a position indicated by two-dot chain lines appearing in FIG. 1 and completely sets the IC device 3 in the IC socket 4, the IC device is released from the vacuum nozzle 18. However, since the plurality of device pressers 11 press on an upper surface of the IC device 3 against the IC socket 4, the electrical connection between the IC device 3 and the IC tester 44 via the IC socket 4 and the printed circuit board 45 is maintained.

After the IC device having been set in the IC socket 4, electric current is supplied to the IC device 3 from the IC tester 44 in predetermined patterns according to an inspection program for execution of various tests.

When the inspection is completed, the IC device carrier head 7 picks up the IC device 3 again, and then moves upward from the position indicated by the two-dot chain lines in FIG. 1 to a position indicated by solid lines in the same, and carries the IC device 3 onto the product tray.

As shown in FIG. 2, the temperature control system 2 includes the magnetometric sensor 20 comprised e.g. of a magneto-resistive element, an A/D converter (conversion means) 21, a temperature sensor (contact temperature measuring element) 22, an A/D converter 23, a control unit (control means) 24, a D/A converter 40, a valve controller 41, and a cold air delivery device (cold air supply means) 25 serving as cooling means (temperature control means).

As shown in FIG. 1, the magnetometric sensor 20 is arranged in the proximity of a conductive pattern (conductive passage) of the printed circuit board 45. The magnetometric sensor 20 is urged toward the printed circuit board 45 by urging means 51 such as a spring. The position of the magnetometric sensor 20 can be switched by a switching mechanism, not shown, between a detecting position shown in FIG. 1 and a retracted position in which the sensor 20 is retracted toward the bottom plate 1a of the chamber 1 against the urging force of the urging means 51. The position of the magnetometric sensor 20 is switched by the switching mechanism to the retracted position before the IC tester 44 is connected to the bottom plate 1a of the chamber 1, and to the detecting position after the connection is established.

The cold air delivery device 25 includes a refrigerant inlet port 26, a cooler 27, a proportional control valve 28, a cooling nozzle 29, a cooling jacket 30, a branch channel 31 for passage of part of cold air therethrough, and a refrigerant outlet port 32.

Compressed dry air is introduced from the refrigerant inlet port 26 and sent into the cooler 27 at a high speed in a circumferential direction.

The cooler 27 operates on the vortex principle for cooling air, and creates an ultra-fast vortex flow within the cooler 27 from the compressed air drawn therein. This vortex flow generates a pressure difference between the inside and outside of the vortex, as a result of which the air flows from a high-pressure side to a low-pressure side, whereby the temperature of the air falls through adiabatic expansion of the air.

The cold air generated in a central portion of the cooler 27 is sent to the cooling nozzle 29 via the proportional control valve 28.

The proportional control valve 28 is a valve for controlling the amount of a jet of cold air for delivery. As described hereinafter, an operating amount (amount of adjustment of opening) of the proportional control valve 28 is controlled by the control unit 24 to a predetermined value dependent on the amount of heat generated by the IC device 3. More specifically, the control unit 24 determines the amount of the generated heat based on an output from the A/D converter 21 connected to the magnetometric sensor 20, and instructs the cold air delivery device 25 to deliver a jet of cold air in a blowing pattern corresponding to the determined amount of the heat.

The cold air delivered from the cooling nozzles 29 is blown between the device pressers 11 onto the IC device 3 in the IC socket 4. Since the jet of cold air is delivered in the blowing pattern corresponding to the amount of the generated heat, the temperature of the IC device 3 is prevented from largely deviating from the set point temperature of the chamber 1.

The cooling jacket 30 is arranged in a manner enclosing the cooling nozzle 29. That is, the cooling jacket 30 and the cooling nozzle 29 form a double tube structure. Part of the cold air in the cooler 27 is supplied via the branch channel 31 to the cooling jacket 30 as an outer tube, and discharged from the refrigerant outlet port 32, whereby cold air in the cooling nozzle 29 as an inner tube is cooled by the cold air in the cooling jacket 30 and held at a predetermined temperature.

Effects of cooling by the cooling jacket 30 prevent the cooling nozzle 29 in a standby state from being warmed by an ambient temperature within the chamber 1, to thereby prevent degradation of cooling efficiency due to an increase in the temperature of the cold air in the cooling nozzle 29.

When the electric current is supplied to the IC device 3 in the IC socket 4 from the IC tester 44 via the printed circuit board 45, a magnetic field is generated In the vicinity of the IC device 3 and the conductive pattern of the printed circuit board 45.

The magnetometric sensor 20 detects the magnetic field formed around the IC device 3, from a position in proximity to the conductive pattern of the printed circuit board 45, i.e. in a non-contact state, and delivers an electric signal which varies with strength of the magnetic field. The electric signal is converted to a digital signal by the A/D converter 21 and sent to the control unit 24 comprised of a CPU, etc.

The control unit 24 selects a suitable blowing pattern (including a time period over which a jet of cold air is delivered, a time interval of delivery of jets of cold air, the flow rate of a jet of cold air, eta.) out of a plurality of blowing patterns provided in advance, based on the amount of the heat generated by the IC device 3 under test, and then instructs the cold air delivery device 25 to blow or deliver a jet of cold air onto the IC device 3 in the selected blowing pattern.

The control unit 24 carries out adjustment of the opening of the proportional control valve 28 by feed forward control.

The output signal delivered from the control unit 24 is converted to an analog signal by the D/A converter 40 and sent to the valve controller 41, from which a signal for controlling the flow rate of the cold air is delivered to the proportional control valve 28 of the cold air delivery device 25. Thus, the opening of the proportional control valve 28 is adjusted, and the IC device 3 is cooled by a jet of cold air thus delivered from the cooling nozzle 29.

Conventionally, the temperature of an IC device 3 under test changes sharply with the value of electric current supplied to the IC device 3. However, the feed forward control performed in the present embodiment is very excellent in the response to changes of a control object. Hence, it is possible to keep the temperature of the IC device 3 substantially constant in quick response to sharp temperature changes even during execution of an inspection program which involves a complicated pattern of sharply fluctuating current values. Incidentally, feedback control in which control is carried out based on the difference between a result of control and a target value of the same is slower in response since it is required to wait for the result, which makes it difficult to properly respond to the sharp changes in the temperature of the IC device 3.

The temperature sensor 22 detects a surface temperature of the IC device 3. A detection signal delivered from the temperature sensor 22 is converted to a digital single by the A/D converter 23 and sent to the control unit 24. The control unit 24 displays the surface temperature of the IC device 3 on a display screen, not shown. The temperature display is utilized by an operator of the Inspection apparatus 1 for monitoring the temperature of the IC device under test and an operating state of the temperature control system 2.

Next, effects of cooling of the IC device 3 by the temperature control system 2 will be described with reference to FIGS. 3 and 4.

FIG. 3 shows various data collected in configuring dr cold air-blowing patterns for the IC device 3. A one-dot chain line 33 shows the amount of heat (W) generated by the IC device 3, while a two-dot chain line 34 shows an output from the magnetometric sensor 20 which detects the magnetic field generated around the IC device. A solid line 35 shows the temperature of the IC device 3 which is measured when the IC device 3 is not cooled by cold air. There is a correlation between the output from the magnetometric sensor 20 (strength of the magnetic field) and the amount of heat (W) generated by the IC device 3.

As shown by the above-mentioned lines, when electric current is passed through the IC device 3, the strength of the magnetic field and the amount of heat generated by the IC device fluctuate in accordance with patterns in which the electric current is supplied. The temperature of the IC device 3 rises with the lapse of time.

FIG. 4 shown cold air-blowing patterns in which Jets of cold air are delivered by the temperature control system 2 and changes in the temperature of the IC device 3. A two-dot chain line 36 shows the output from the magnetometric sensor 20, while a broken line 37 shows states of delivery and stoppage of jets of cold air. A solid line 38 shows changes in the temperature of the IC device 3 cooled by the cold air.

Each of the cold air-blowing patterns is set such that it corresponds to a change in the amount of the heat generated by the IC device 3. Each time period over which a Jet of cold air is delivered, time intervals of delivery of Jets, and the flow rate of cold air delivered by the Jet, all of which are represented by the broken line 37 in FIG. 5, are delicately adjusted according to a corresponding change in the temperature of the IC device 3 indicated by the solid line 38 in the figure.

Consequently, as shown by the solid line 38, although the temperature of the IC device 3 changes with the lapse of time, the change in the temperature is held within a range of ±2° C.

According to the present embodiment, it is possible to measure changes in the temperature of the IC device 3 accurately without scratching or soiling a package of the IC device 3. Further, the embodiment enables correct evaluation of performance of the IC device 3 without any need to incorporate a temperature sensor in the IC sensor 3, which contributes to reduction of manufacturing costs of the IC device 3.

Moreover, according to the present embodiment, the control unit 24 estimates every change in the temperature of the IC device 3, based on information of the amount of the generated heat from the A/D converter 21, and then delivers a control signal for adjusting an operating amount to be applied to the proportional control valve 28 of the cold air delivery device 25 to a predetermined value corresponding to the estimated temperature change, to thereby cause the cold air delivery device 25 to appropriately cool the IC device 3. Therefore, the IC device inspection apparatus is excellent in response to the temperature change of the IC device 3, and hence capable of maintaining the temperature of the IC device 3 within a narrow predetermined temperature range (between temperatures which are 2° C. higher and lower than the set point temperature of the chamber 1), differently from the prior art in which the temperature of the IC device 3 under test fluctuates sharply with changes in value of the electric current supplied to the IC device 3. This enable the apparatus to carry out highly accurate inspection of IC devices 3.

Further, since it is not required to bring the magnetometric sensor 20 into contact with the IC device 3 in detecting the magnetic field, the IC device cannot be scratched or soiled.

Further, it is possible to prevent the cooling nozzle 29 in a standby state from being warmed by the ambient temperature within the chamber 1, to thereby prevent the temperature of the cold air blown from the cooling nozzle 29 from rising, so that cooling efficiency of the cold air delivery device 25 can be enhanced.

Further, since the printed circuit board 45 is arranged outside the chamber 1, and the magnetometric sensor 20 is positioned close to the conductive pattern of the printed circuit board 45, magnetic noise produced within the chamber 1 (mainly by the motor) has little adverse effect on the magnetometric sensor 20, and at the same time, is possible to prevent sensing characteristics of the magnetometric sensor 20 from being seriously changed when testing causes an IC device to generate heat to heat itself to high-temperatures. This enables more correct evaluation of performance of the IC device.

Although it is required to change the location of the magnetometric sensor 20, dependent on the size of an IC device to be inspected, this embodiment facilitates positioning of the magnetometric sensor 20 in comparison with the prior art in which the magnetometric sensor 20 is required to be arranged close to the IC device.

Moreover, since the magnetometric sensor 20 is urged toward the printed circuit board 45 by the urging means 51, the distance between the magnetometric sensor 20 and the conductive pattern of the printed circuit board 45 can be maintained constant, which enables stable detection of the magnetic field.

Although in the above embodiment, the cold air produced by the cooler 27 utilizing the vortex principle is used for cooling the IC device 3, this is not limitative, but cold air produced e.g. by compressing a gas by the use of a compressor and then expanding the same adiabatically, or gaseous nitrogen utilizing latent heat of vaporization of liquid nitrogen may be used for the same purpose.

As far as the magnetometric sensor is concerned, any element, such as a Hall element or an electromagnetic induction coil, which is capable of detecting the magnetic field, may be used in place of the magneto-resistive element.

It is further understood by those skilled in the art that the foregoing is the preferred embodiment of the invention, and that various changes and modification may be made without departing from the spirit and scope thereof.

What is claimed is:

1. An IC device inspection apparatus comprising:
   a chamber for receiving therein an IC device to be inspected;

an IC tester for judging performance of said IC device;

electrical connection means arranged outside said chamber and having a conductive passage electrically connecting between said IC tester and said IC device;

an IC socket retained on said electrical connection means, for having said IC device inserted therein;

magnetometric detection means arranged close to said conductive passage of said electrical connection means, for detecting a magnetic field generated when electric current is supplied from said IC tester to said IC device;

temperature control means for controlling a temperature of said IC device; and control means for controlling said temperature control means based on a signal delivered from said magnetometric detection means, to maintain said temperature of said IC device within a predetermined temperature range.

2. An IC device inspection apparatus according to claim 1, including conversion means for converting said signal delivered from said magnetometric detection means to information indicative of an amount of heat generated by said IC device, and wherein said control means controls said temperature control means based on said information from said conversion means, to maintain said temperature of said IC device within said predetermined temperature range.

3. An IC device temperature control system according to claim 2, said temperature control means comprises cold air supply means for supplying a jet of cold air to said IC device, and wherein said control means controls both of a time period over which said jet of cold air is supplied to said IC device and a flow rate of said Jet of said cold air, in a feed forward manner based on said information from said conversion means.

4. An IC device inspection apparatus according to claim 1, wherein said chamber has a bottom plate formed with an opening extending therethrough, said IC socket being inserted in said opening, said magnetometric detection means being mounted on an underside of said bottom plate.

5. An IC device inspection apparatus according to claim 1, wherein said electrical connection means comprises a printed circuit board.

* * * * *